(12) United States Patent
Bondokov et al.

(10) Patent No.: US 11,124,892 B2
(45) Date of Patent: *Sep. 21, 2021

(54) DEFECT REDUCTION IN SEEDED ALUMINUM NITRIDE CRYSTAL GROWTH

(71) Applicants: Robert T. Bondokov, Watervliet, NY (US); Kenneth E. Morgan, Castleton, NY (US); Leo J. Schowalter, Latham, NY (US); Glen A. Slack, Scotia, NY (US)

(72) Inventors: Robert T. Bondokov, Watervliet, NY (US); Kenneth E. Morgan, Castleton, NY (US); Leo J. Schowalter, Latham, NY (US); Glen A. Slack, Scotia, NY (US)

(73) Assignee: CRYSTAL IS, INC., Green Island, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/881,148

(22) Filed: May 22, 2020

(65) Prior Publication Data

US 2020/0354852 A1 Nov. 12, 2020

Related U.S. Application Data

(63) Continuation of application No. 16/160,158, filed on Oct. 15, 2018, now Pat. No. 10,697,085, which is a continuation of application No. 15/463,536, filed on Mar. 20, 2017, now Pat. No. 10,125,432, which is a continuation of application No. 14/458,825, filed on Aug. 13, 2014, now Pat. No. 9,670,591, which is a continuation of application No. 13/669,630, filed on Nov. 6, 2012, now Pat. No. 8,834,630, which is a continuation of application No. 12/015,957, filed on Jan. 17, 2008, now Pat. No. 8,323,406.

(Continued)

(51) Int. Cl.
| | |
|---|---|
| *C30B 23/00* | (2006.01) |
| *C30B 23/02* | (2006.01) |
| *C30B 29/40* | (2006.01) |
| *H01L 21/02* | (2006.01) |

(52) U.S. Cl.
CPC ............ *C30B 23/025* (2013.01); *C30B 23/00* (2013.01); *C30B 29/403* (2013.01); *H01L 21/02389* (2013.01); *Y10T 428/2982* (2015.01)

(58) Field of Classification Search
CPC ...... C30B 23/00; C30B 23/025; C30B 29/403
See application file for complete search history.

(56) References Cited

U.S. PATENT DOCUMENTS

| 8,080,833 B2 | 12/2011 | Grandusky et al. |
| 8,323,406 B2 * | 12/2012 | Bondokov ............ C30B 23/025 |
| | | 117/80 |

(Continued)

*Primary Examiner* — Robert M Kunemund
(74) *Attorney, Agent, or Firm* — Morgan, Lewis & Bockius LLP

(57) ABSTRACT

Bulk single crystal of aluminum nitride (AlN) having an areal planar defect density ≤100 cm$^{-2}$. Methods for growing single crystal aluminum nitride include melting an aluminum foil to uniformly wet a foundation with a layer of aluminum, the foundation forming a portion of an AlN seed holder, for an AlN seed to be used for the AlN growth. The holder may consist essentially of a substantially impervious backing plate.

21 Claims, 10 Drawing Sheets

Related U.S. Application Data

(60) Provisional application No. 60/880,869, filed on Jan. 17, 2007.

(56) References Cited

U.S. PATENT DOCUMENTS

| | | |
|---|---|---|
| 8,834,630 B2 | 9/2014 | Bondokov et al. |
| 9,624,601 B2 | 4/2017 | Bondokov et al. |
| 9,670,591 B2 | 6/2017 | Bondokov et al. |
| 9,771,666 B2 | 9/2017 | Bondokov et al. |
| 10,125,432 B2 | 11/2018 | Bondokov et al. |
| 10,392,722 B2 * | 8/2019 | Bondokov ............ C30B 29/403 |
| 10,697,085 B2 * | 6/2020 | Bondokov .............. C30B 23/00 |
| 2009/0283028 A1 | 11/2009 | Schowalter et al. |
| 2017/0350036 A1 | 12/2017 | Bondokov et al. |
| 2019/0106808 A1 | 4/2019 | Bondokov et al. |
| 2020/0002841 A1 | 1/2020 | Bondokov et al. |

* cited by examiner

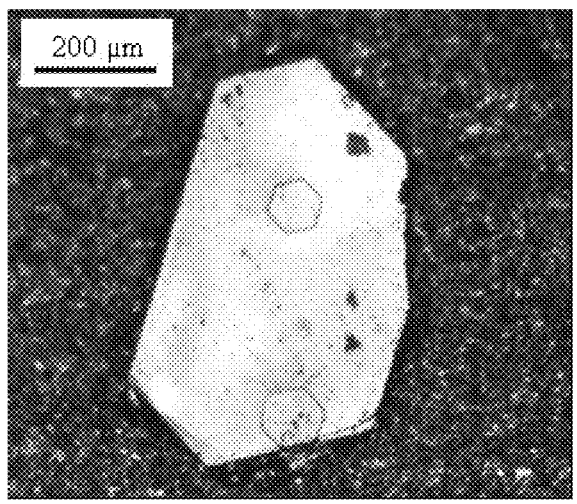 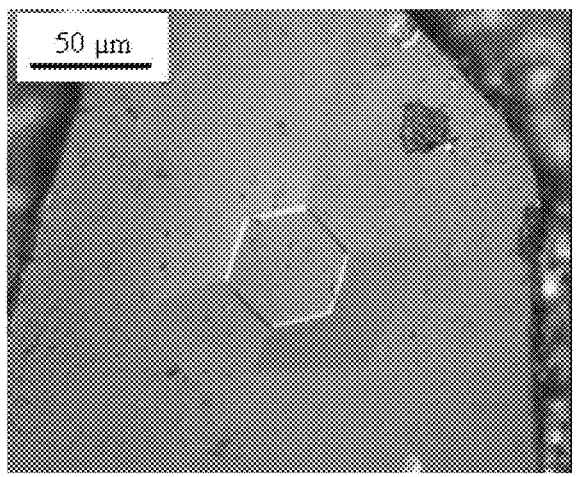
Figure 3a                                   Figure 3b

DEFECT REDUCTION IN SEEDED ALUMINUM NITRIDE CRYSTAL GROWTH

RELATED APPLICATION

This application is a continuation of U.S. patent application Ser. No. 16/160,158, filed on Oct. 15, 2018 now U.S. Pat. No. 10,697,085, which is a continuation of U.S. patent application Ser. No. 15/463,536, filed on Mar. 20, 2017 now U.S. Pat. No. 10,125,432, which is a continuation of U.S. patent application Ser. No. 14/458,825, filed on Aug. 13, 2014 now U.S. Pat. No. 9,670,591, which is a continuation of U.S. patent application Ser. No. 13/669,630, filed on Nov. 6, 2012, now issued as U.S. Pat. No. 8,834,630, which is a continuation of U.S. patent application Ser. No. 12/015,957, filed on Jan. 17, 2008, now issued as U.S. Pat. No. 8,323,406, which claims the benefit of and priority to U.S. Provisional Application Ser. No. 60/880,869 filed Jan. 17, 2007, the disclosure of each of which is hereby incorporated by reference in its entirety.

GOVERNMENT SUPPORT

This invention was made with United States Government support under 70NANB4H3051 awarded by the National Institute of Standards and Technology (NIST). The United States Government has certain rights in the invention.

FIELD OF THE INVENTION

The present invention relates to the fabrication of single crystal AlN, and, more specifically, to the fabrication of single crystal AlN having low planar defect densities.

BACKGROUND

Aluminum nitride (AlN) holds great promise as a semiconductor material for numerous applications, e.g., opto-electronic devices such as short-wavelength light-emitting diodes (LEDs) and lasers, dielectric layers in optical storage media, electronic substrates, and chip carriers where high thermal conductivity is essential, among many others. In principle, the properties of AlN may allow light emission down to around 200 nanometers (nm) wavelength to be achieved. The use of AlN substrates is also expected to improve high-power radio-frequency (rf) devices, made with nitride semiconductors, due to the high thermal conductivity with low electrical conductivity. Addressing various challenges can help increase the commercial practicability of such devices.

For example, large-diameter bulk AlN crystals (grown, for example, using the techniques described in U.S. application Ser. No. 11/503,660, incorporated herein in its entirety, referred to hereinafter as the "'660 application"), may in some circumstances grow with hexagonal-prism shaped cavities defects that are roughly 0.5 millimeter (mm) in diameter and 0.1 mm thick. Area concentrations as high as 100 cm$^{-2}$ have been observed in AlN slices that are cut to be 0.5 mm thick from these large diameter boules. Similar kinds of defects have been observed in the growth of other hexagonal crystals, such as SiC, and are commonly referred to as planar defects. These defects may be problematic for the further development of nitride-based electronics. In particular, they typically cause the surface of a substrate to roughen when they intersect the surface plane. They may also scatter light, which may be problematic for many opto-electronic applications that benefit from the transparency of AlN substrates at optical wavelengths between 210 and 4500 nm. Planar defects may also reduce the thermal conductivity around the defect, an effect that is generally undesirable for high-power devices in which the high intrinsic thermal conductivity of the AlN is useful. They may also introduce small angle grain boundaries into the AlN crystal and, thus, degrade the quality of the crystal by increasing the effective concentration of dislocations that thread through from one side of the wafer to the other (so-called threading dislocations) and that degrade the quality of surface preparation. Thus, the application of AlN substrates to the fabrication of high-performance, high-power opto-electronic and electronic devices may be enhanced if planar defects are reduced or eliminated.

Generally, planar defect formation in crystals grown by physical vapor transport (PVT) is caused by voids that get trapped in the growing crystal and that move and are shaped by the thermal gradients to which the crystal is exposed. A common cause identified in SiC crystal growth is poor seed attachment, where any kind of a microscopic void will commonly result in the formation of a planar defect (see, e.g., T. A. Kuhr, E. K. Sanchez, M. Skowronski, W. M. Vetter and M. Dudley, *J. Appl. Phys.* 89, 4625 (2001) (2001); and Y. I. Khlebnikov, R. V. Drachev, C. A. Rhodes, D. I. Cherednichenko, I. I. Khlebnikov and T. S. Sudarshan, Mat. Res. Soc. Proc. Vol. 640, p. H5.1.1 (*MRS* 2001), both articles being incorporated herein by reference in their entireties). In particular, poor seed attachment may cause voiding to occur between the seed and seed holder or may leave the back surface of the seed inadequately protected, allowing AlN material to sublime from that surface. For AlN crystal growth, crucible abnormalities, such as wall porosity or a seed mounting platform in which voids are present or can form, may also be a cause of voiding.

A typical planar defect 10 is shown schematically in FIG. 1. In some cases the shape of the planar defects is not perfectly hexagonal but modified or distorted and even triangular depending on the tilt between the planar void and the c-plane {0001} of AlN. In addition, there is typically a small-angle grain boundary 20 in the trail of the planar defect as shown in the schematic diagram, the origin of which is discussed below. The planar defect has a height $h_1$, and leaves a planar defect trail of length $h_2$ that extends back to the origin of the planar defect, typically the back of the seed crystal.

FIGS. 2a and 2b show optical microscopy images of a 2-inch diameter, c-face (i.e., c-axis oriented parallel to the surface normal of the wafer) AlN substrate taken after fine mechanical polishing. The right-side image (FIG. 2b) represents the same location as in the left-side image (FIG. 2a) taken in cross-sectioned analyzer-polarizer (AP) mode. The planar defect dimensions vary from 0.1 to 2 mm in width and up to 0.5 mm in depth, although they generally tend to be thinner (~0.1 mm). However, the base of the planar defect is typically misoriented with respect to the overall crystal (typically a small rotation about the c-axis), and thus there is a boundary between the original crystal and the slightly misoriented material that is below the planar defect. This boundary is defined by dislocations that account for the misorientation of the material below the planar defect.

Causes of Planar Defects

If the AlN seed is poorly attached in a way that allows material in the back of the seed to move under the temperature gradient, then this material movement may cause voids to "enter" the seed. This effect is due to the fact that every void has a small but defined axial gradient that drives material to be evaporated and then re-condensed within the void. The voids entering the AlN bulk material form well-defined hexagonal-prism shapes, probably because of the anisotropy in surface energy formation.

Migration of the Planar Defect in a Thermal Gradient and Resulting Degradation of Crystal Referring to FIGS. 3a and 3b, growth inside planar defects has been documented. The growth facet in FIG. 3b is pronounced, indicating faceted growth mode within the planar defect. Faceted growth mode usually results in a high-quality crystal. It can be expected, therefore, that the material quality within the planar defect is high and may be dislocation-free.

As the crystal grows, the planar defects effectively migrate toward the growth interface due to the axial temperature gradient within the void. Planar defects travel from the seed toward the growth interface because of the axial gradient across the planar height. As a result of this movement, the planar defects may leave "trails" (or imprints) of grain boundaries with very small misorientation angles. These small-angle grain boundaries are pronounced and shaped according to the planar defect symmetry. An example of this is shown in FIG. 4 and discussed below.

According to the traditional Read's model of low-angle grain boundaries, a boundary typically contains pure edge dislocations lying in the plane of the boundary. Therefore, after etching, the boundary is expected to exhibit a number of separated etch pits. The greater the distance between the pits, the smaller will be the misorientation angle. The grain boundary angle may be found using Frank's formula:

$$\frac{b}{D} = 2\sin\left(\frac{\theta}{2}\right), \quad (1)$$

where D is the distance between dislocations (etch pits), b is the Burgers vector of dislocation, and θ is the misorientation angle. In FIG. 4, the closest distance between the etch pits is ~12 micrometers (μm), and the Burgers vector for pure edge dislocation perpendicular to the {0001} planes is equal to the "a" lattice constant, i.e. 0.3111 nm. Therefore, the azimuthal misorientation angle of the planar defect walls is expected to be about 0.0004° (or 1.44 arcsec).

Thus, in addition to the problems caused by the physical presence of planar defects, the formation and motion of planar defects in the crystal during growth may also degrade the overall crystal quality. This degradation results because of the slight misorientation between the planar defect body and the AN bulk material. As the planar defect moves through the crystal, it leaves behind a grain boundary, as shown in FIG. 1. These grain boundaries typically show misorientation of about 2 arcseconds for individual planar defects. However, if the density of the planar defects is high, each of these randomly misoriented grain boundaries can add up and result in much higher "effective" misorientation and, as a result, much lower crystal quality. An alternative way to look at the degradation of crystal quality is to consider the increase in threading dislocation density due to the planar defects. As one may calculate from the micrograph shown in FIG. 4, each planar defect may create over $10^4$ dislocations/cm$^2$ in its wake.

Problems with Surface Preparation Due to Planar Defects

Planar defects may affect preparation and polishing of AlN wafers. The sharp edges of planar defects intersecting the AlN sample surface may chip off and cause scratching. In addition, planar defects—being related to the small-angle grain boundaries (SAGB)—may result in surface roughening (topography) during chemical-mechanical polishing (CMP) treatment.

FIG. 5 shows the surface and the bulk depth of AlN containing planar defects and LAGB, where the images are obtained at the same location. It is clear that the planar defects and the SAGB cause surface roughening which, in turn, affects the epitaxial growth.

Problems with Optical Transparency and Thermal Conductivity

Planar defects may have a negative impact on the optical-transmission properties of AlN wafers because they scatter light due to the introduction of additional interfaces within the crystal, which separate regions with different refractive indices. In addition, while AlN substrates are attractive because of their high thermal conductivity (which can exceed 280 W/m-K at room temperature), planar defects may cause the thermal conductivity to diminish in a location directly above the planar defect because of the extra interfaces that are inserted at the planar defect boundaries as well as the thermal resistance of the volume of the planar defect itself. This local increase of the thermal resistance of the AlN substrate may reduce the usefulness of the AlN substrates for applications that require high power dissipation, e.g., high-power RF amplifiers and high-power, high-brightness LEDs and laser diodes.

Limitations of Existing Methods

As described in the '660 application, the production of large-diameter (i.e., greater than 20 mm) AlN crystals typically requires seeded growth. However, as discussed below, the seed holder and seed mounting technique on the holder are primary sources of planar defects in the AlN boules that are produced. The '660 application discloses a method for AlN seed attachment and subsequent crystal growth. Referring to FIG. 6, an AlN ceramic-based, high-temperature adhesive bonds the AlN seed to the holder plate and at the same time protects the back of the AlN seed from sublimation. In particular, an AlN seed 100 is mounted onto a holder plate 130 using an AlN-based adhesive 140. The AlN ceramic adhesive may contain at least 75% AlN ceramic and silicate solution that provides adhesive properties. One suitable example of such an adhesive is Ceramabond-865 available from Aremco Products, Inc.

In a particular version, the AlN seed is mounted using the following procedure:

(1) AlN adhesive is mixed and applied to the holder plate using a brush to a thickness not exceeding about 0.2 mm;
(2) The AlN seed is placed on the adhesive; and then
(3) The holder plate along with the seed is placed in a vacuum chamber for about 12 hours and then heated up to 95° C. for about 2 hours.

This approach has proven successful in providing high-quality, large-diameter AlN crystal boules. However, planar defects as shown in FIG. 2 will form. This problem is caused by the voids left behind as the silicate solution is either evaporated or absorbed by the AlN seed crystal or by Al escaping through the seed holder.

An alternative method for AlN seed attachment and subsequent crystal growth described in the '660 application involves mounting the AlN seed on a thin foil of Al on the holder plate. The Al is melted as the temperature of the furnace is raised above 660° C. (the melting point of Al), thereby wetting the back of the seed and the holder plate. As the temperature is raised further, the Al reacts with N$_2$ in the furnace to form AlN, which secures the seed to the holder plate. This technique may require that the AlN seed be held in place (either by gravity or mechanically) until a sufficient amount of the Al has reacted to form AlN, after which no further mechanical support is needed.

This technique, too, results in planar defects. The Al foil may melt and ball up, leaving empty spaces between agglomerations of liquid Al. The agglomerated liquid-Al metal may then react to form a nitride, leaving empty spaces between the seed and the seed holder. These empty spaces, in turn, can lead to planar defects once crystal growth is initiated on the seed crystal. The interaction between the AlN seed and the seed holder may also contribute to defects. Typically some amount of diffusion of either Al or N (or both) into the seed holder occurs at the temperatures used for crystal growth. For instance, a tungsten (W) seed holder may absorb both Al and N at the growth temperature, which can result in planar defects forming in the seed crystal and in the resulting boule grown from the seed crystal. In addition, the seed holder may have a thermal expansion coefficient different from that of the AlN crystal, which may cause defects in the seeded crystal or may induce voids to open up at the seed crystal/seed holder interface, resulting in planar defects during subsequent boule growth.

Another way to attach the seed crystal to the seed holder is to run a heat cycle under conditions whereby the seed is held onto the seed backing (e.g., by placing the seed crystal under an appropriate mass that holds the crystal down during this process), and heating the crystal up to a temperature above 1800° C. (and preferably above 2000° C.) to allow the seed to thermally, chemically and/or mechanically bond to the seed holder material. This approach is referred to herein as sinter bonding. The sintering process may, however, be difficult to control such that good bonding occurs without damaging the seed. In addition, it may be difficult to avoid leaving some space between the seed crystal and the seed holder. This space may be filled during processing with AlN that mostly comes from the seed crystal (even when vapors of Al and $N_2$ are supplied by having an AlN ceramic present in the crucible during the sintering process), and this AlN may induce planar defects to form in the seed crystal that may propagate into the single-crystal boule grown on the seed crystal.

SUMMARY

Embodiments of the invention allow the reduction or elimination of planar defects during the growth of bulk aluminum nitride (AlN) crystals, i.e., boules. In particular, in some embodiments, the areal planar defect density is reduced to less than 100/cm$^2$ and, preferably, to less than 1/cm$^2$. As a result, the fabrication of crystalline AlN wafers larger than 20 mm in diameter with a thickness ranging from 0.1-1 mm and having planar defect density of less than 1 cm$^{-2}$ is enabled.

Key factors that enable growing seeded, large diameter, high quality AlN crystals include:

1.) The seed crystal itself is free of planar defects, as well as free from other kinds of defects that may form voids (that generally evolve into planar defects at the crystal growth temperature). A defect to be considered is subsurface damage that may be introduced into the seed crystal by the cutting and polishing process.

2.) The seed is attached to a seed holder (with seed holder being defined in the '660 application and described in detail above with reference to FIG. 6) in such a way as to prevent the formation of voids between the seed and the seed holder. This may be accomplished by properly preparing the back surface of the seed (also referred to as the mounting surface of the seed, as opposed to the front surface of the seed that is used to seed the bulk crystal growth) as well as the surface of the seed holder. A film is then applied to the back of the seed, conforming microscopically with both the back surface of the seed as well as the seed holder. This film is preferably completely dense (i.e., no microscopic voids).

3.) The seed holder is relatively impervious to aluminum transport so as not to form voids in growing AlN crystal. In some examples, the film used to attach the seed to the seed holder is, itself, impervious to aluminum transport. In some of the implementations described below, the seed holder is only impervious to aluminum transport for a certain period of time. This time limitation generally limits the length of the AlN boule that can be grown.

Since a principal way the AlN crystal compensates for the diffusion of Al out of the crystal is by the formation of planar defects, the maximum allowable rate for transport through the seed holder assembly may be estimated for a given planar defect density. For instance, to keep the density of planar defects below 100/cm$^2$, the maximum allowable number of atoms of Al that may be allowed to diffuse through the seed holder assembly is generally <$10^{20}$/cm$^2$ over the period of time that the AlN crystal is being grown. To keep the planar defect density below 1/cm$^2$, the Al diffusion is preferably kept below $10^{18}$ atoms of Al per cm$^2$.

4.) Stress between the seed holder assembly and the seed is reduced. This may be achieved by (i) either the thermal expansion of the seed holder assembly nearly matching the thermal expansion of the AlN seed in the temperature range from room temperature up to the growth temperature (~2200° C.), or (ii) the seed holder assembly being sufficiently mechanically flexible to absorb the thermal expansion mismatch through deformation while reducing the strain on the seed crystal and the resulting AlN boule. This factor does not typically allow the achievement of the third factor above by simply making the seed holder thicker.

5.) Generally, it is also desirable for the seed holder assembly to have enough mechanical strength to be able to support the growing AlN boule while, at the same time, providing a sealing surface to the crucible used to contain the AlN material and Al vapor (as described in the '660 application). However, the mechanical strength needed typically depends on the crystal growth geometry used. Less mechanical strength may be needed if the seed crystal is placed at the bottom of the crystal growth crucible; this geometry, however, may need tighter control of the AlN source material to prevent particles falling from the source material nucleating defects in the growing crystal.

Moreover, conditions for high quality AlN crystal growth are preferably followed, as described in the '660 application. In particular, super-atmospheric pressures may be successfully utilized to produce single crystals of AlN at relatively high growth rates and crystal quality. To achieve this, one or more of the following may be controlled: (i) temperature difference between an AlN source material and growing crystal surface, (ii) distance between the source material and the growing crystal surface, and (iii) ratio of $N_2$ to Al partial vapor pressures. Increasing the $N_2$ pressure beyond the stoichiometric pressure may force the crystal to grow at a relatively high rate due to the increased reaction rate at the interface between the growing crystal and the vapor. This increase in the growth rate has been shown to continue with increasing $N_2$ partial pressure until diffusion of Al from the source to the growing crystal (i.e., the negative effects of requiring the Al species to diffuse through the $N_2$ gas) becomes the rate-limiting step. Employing higher-pressure nitrogen may have the added benefit of reducing the partial pressure of aluminum inside the growth crucible, which may decrease corrosion within the furnace often caused by Al vapor inadvertently escaping the crucible. To grow high-quality AlN crystals, very high temperatures, for example exceeding 2100° C., are generally desirable. At the same time, high thermal gradients are needed to provide sufficient mass transport from the source material to the seed crystal. If not chosen properly, these growth conditions may result in evaporation of seed material or its total destruction and loss. The AlN seeded bulk crystal growth may be carried out in a tungsten crucible using a high-purity AlN source. The tungsten crucible is placed into an inductively heated furnace so that the temperature gradient between the source and the seed material drives vapor species to move from hotter high purity AlN ceramic source to the cooler seed crystal. The temperature at the seed interface and the temperature gradients are monitored and carefully adjusted, if necessary, in order to nucleate high-quality mono-crystalline material on the seed and not destroy the AlN seed.

Hereinafter, several ways to implement these concepts are described in detail, and specific examples of implementation are provided.

In an aspect, embodiments of the invention may include a bulk single crystal of AlN having a diameter greater than 20 mm, a thickness greater than 0.1 mm, and an areal planar defect density may be less than or equal to 100 $cm^{-2}$.

One or more of the following features may be included. The areal planar defect density may be measured by counting all planar defects in the bulk single crystal and dividing by a cross-sectional area of the bulk single crystal disposed in a plane perpendicular to a growth direction thereof. The bulk single crystal may be in the form of a boule having a thickness greater than 5 mm. The areal planar defect density may be less than or equal to 1 $cm^{-2}$.

The single crystal AlN may be in the form of a wafer. The areal planar defect density may be less than or equal to 10 $cm^{-2}$. An areal planar defect density of planar defects intersecting each of a top and a bottom surface of the wafer may be less than or equal to 1 $cm^{-2}$.

In another aspect, embodiments of the invention may include a boule including a bulk single crystal of AlN having a diameter greater than 20 mm, a thickness greater than 5 mm, and an areal density of threading dislocations of less than or equal to $10^6$ $cm^{-2}$ in each cross-section of the bulk single crystal disposed in a plane perpendicular to a growth direction of the crystal. In some embodiments, the areal density of threading dislocations may be less than or equal to $10^4$ $cm^{-2}$.

In yet another aspect, embodiments of the invention feature a boule includes a bulk single crystal of AlN having a sufficient thickness to enable the formation of at least five wafers therefrom, each wafer having a thickness of at least 0.1 mm, a diameter of at least 20 mm, and a threading dislocation density of less than or equal to $10^6$ $cm^{-2}$. In some embodiments, each wafer may have a threading dislocation density less than or equal to $10^4$ $cm^{-2}$.

In still another aspect, embodiments of the invention include a boule including a substantially cylindrical bulk single crystal of AlN having a diameter of at least 20 mm and having a sufficient thickness to enable the formation of at least five wafers therefrom, each wafer having a thickness of at least 0.1 mm, a diameter of at least 20 mm, and a triple-crystal X-ray rocking curve of less than 50 arcsec full width at half maximum (FWHM) for a (0002) reflection. Each wafer has substantially the same diameter as each of the other wafers.

In another aspect, embodiments of the invention include a method for growing single-crystal aluminum nitride (AlN). The method includes providing a holder including a backing plate, the holder (i) being sized and shaped to receive an AlN seed therein and (ii) including an AlN foundation bonded to the backing plate. An Al foil is interposed between the seed and the AlN foundation. The Al foil is melted to uniformly wet the foundation with a layer of Al. An AlN seed is disposed within the holder. Aluminum and nitrogen are deposited onto the seed under conditions suitable for growing single-crystal AlN originating at the seed.

One or more of the following features may be included. The back plate may be conditioned to reduce permeability of the back plate to Al. The seed crystal may be a wafer having a diameter of at least 20 mm. The grown single-crystal AlN may define a boule having a diameter approximately the same as a diameter of the seed crystal.

In another aspect, embodiments of the invention feature a method for growing single-crystal aluminum nitride (AlN). The method includes providing a holder sized and shaped to receive an AN seed therein, the holder consisting essentially of a substantially impervious backing plate. An AlN seed is disposed within the holder. An Al foil is interposed between the seed and the backing plate. The Al foil is melted to uniformly wet the backing plate and the back of the AlN seed with a layer of Al. Aluminum and nitrogen are deposited onto the seed under conditions suitable for growing single-crystal AlN originating at the seed.

BRIEF DESCRIPTION OF THE DRAWINGS

In the drawings, like reference characters generally refer to the same features throughout the different views. Also, the drawings are not necessarily to scale, emphasis instead generally being placed upon illustrating the principles of the invention. In the following description, various embodiments of the present invention are described with reference to the following drawings, in which:

FIGS. 3a and 3b are micrographs demonstrating growth features inside planar defects, that are due to the movement of the planar defects during the crystal growth, with FIG. 3a being an optical micrograph, and 3b being a micrograph taken in Nomarski Differential Image Contrast (NDIC);

DETAILED DESCRIPTION

In accordance with some embodiments of the invention, one or more of the measures described below may be taken to reduce defect generation during seeded AlN growth of, e.g., boules.

As used herein, boule means an as-grown crystal of AlN that has predominately (more than 50%) a single orientation. To be technologically useful, the boule is preferably at least 20 mm in diameter and more than 5 mm in length, and the orientation preferably varies by no more than 1.5° across the width of the boule.

As used herein, wafer means a slice of AlN cut from a boule. Typically, a wafer has a thickness of between 0.1 mm to 1 mm and a diameter greater than 20 mm. However, wafers thinner than 0.1 mm, while fragile, may be technologically useful for some specialized applications (for instance, in an application where optical transmission through the wafer is critical).

High quality bulk single crystal AlN having low planar defect densities, and methods for formation thereof, are disclosed herein. Referring again to FIG. 4, each planar defect may create over $10^4$ dislocations/$cm^2$ in its wake. Thus, to prepare AlN wafers (which are thin slabs, typically 0.1 to 1 mm thick, cut from the bulk crystal) with threading dislocation densities (TDD) below $10^6$/$cm^2$, the areal planar defect density (defined as the number of planar defects that have passed through a unit area in the bulk crystal) is generally kept below 100/$cm^2$ or below 1/$cm^2$ if the TDD is to be kept below $10^4$/$cm^2$. An areal planar defect density may be measured by counting all planar defects in a bulk single crystal and dividing by a cross-sectional area of the bulk single crystal disposed in a plane perpendicular to a growth direction thereof. Because the temperature gradient along the crystal height increases toward the seed, so one may generally expect that the density of planar defects would decrease toward the growth interface (crown).

Figure 1:
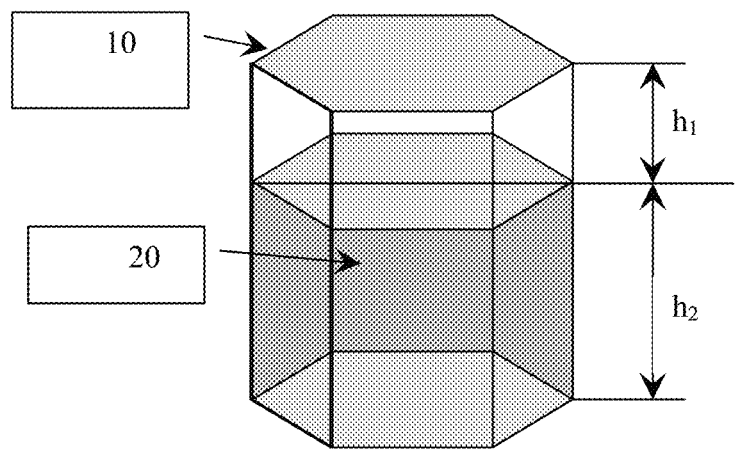
FIG. 1 is a schematic diagram showing an idealized planar defect which typically appear as hexagonal voids in the AlN crystal.
Figure 2A:
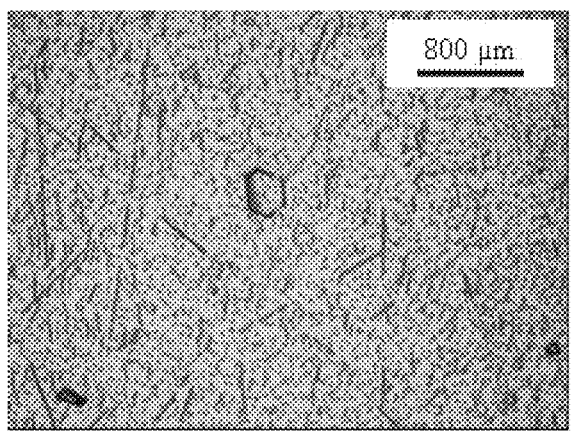
FIGS. 2a and 2b are optical micrographs of AlN single crystal sample containing planar defects: a) an optical image showing one planar defect, and b) image taken from the same location in birefringence contrast showing multiple planar defects just underneath the surface.
Figure 2B:
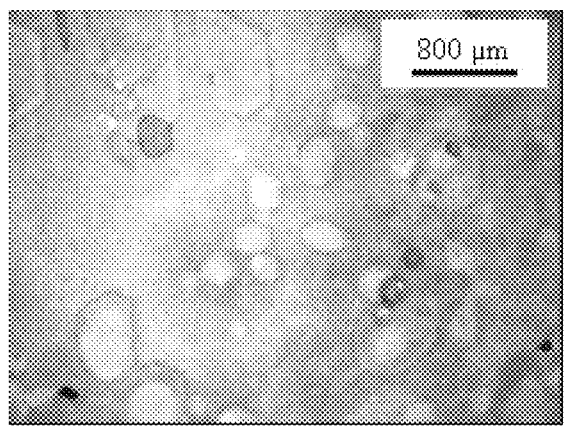
Figure 4:
FIG. 4 is an NDIC micrograph of the planar defect wake and grain boundaries marked by an etch pit associated with dislocations.
Figure 5A:
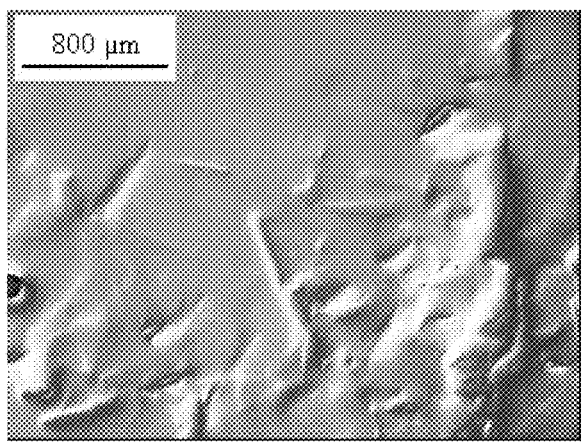
FIGS. 5a and 5b are micrographs illustrating the effect of the low-angle grain boundaries due to planar defects on the surface finish, with FIG. 6a taken after the CMP process, and 6b being a birefringence contrast image from the same location showing planar defects.
Figure 5B:
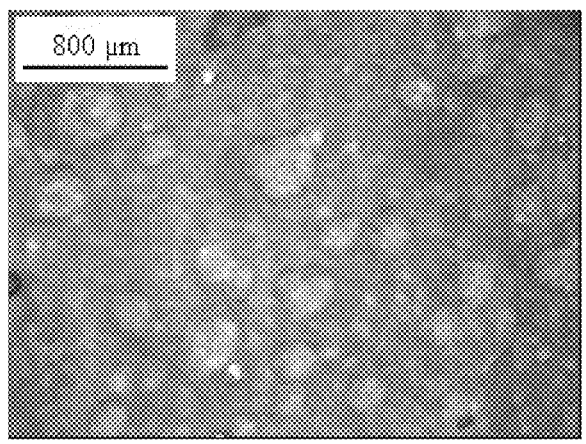
Figure 7:
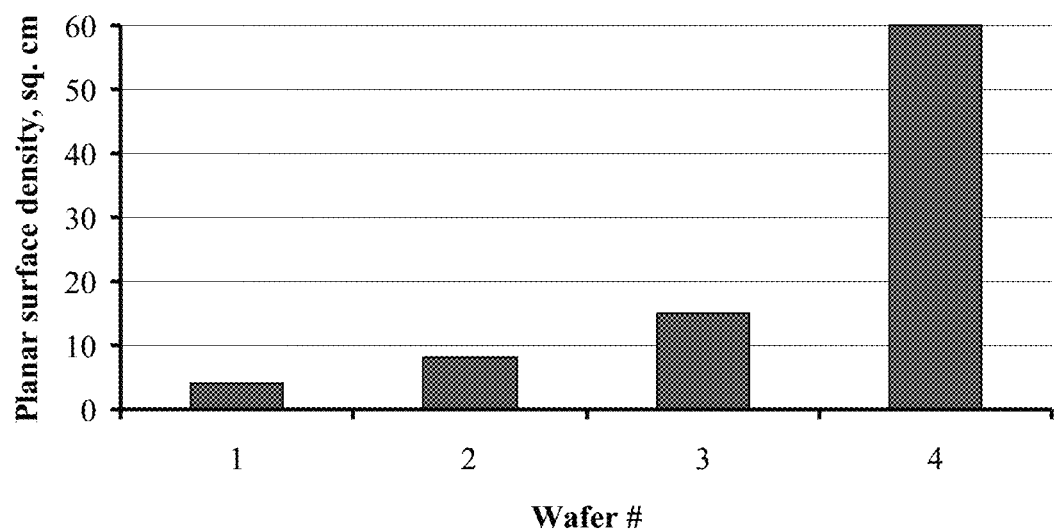
FIG. 7 is a graph illustrating the axial distribution (along the growth axis) of the density of planar defects intersecting the surface of a slice through the boule: wafer #1 is closest to the growth interface while wafer #4 is closest to the seed.

An illustration of this effect in AlN boules is shown in FIG. 7, that shows the axial distribution (along the growth axis) of the density of planar defects that intersect the surface of the wafer, with wafer #1 being closest to the growth interface (crown) while wafer #4 is closest to the seed. The planar defects that intersect the surface of wafer #1 have passed through the region of the boule represented by wafer #4, which may be observed by etching their trails as shown in FIG. 4. Since it may be difficult to see all the planar defects in a thick boule, the areal density may be measured by cutting a thin slice (0.1 to 0.8 mm thick) from the boule perpendicular to the growth direction and polishing both surfaces of the slice with any anisotropic etch. The areal planar defect density may then be estimated by totaling the number of planar defects observed in the slice (both on the surface and under the surface) and the number of planar defect trails that are observed on the surface of the slice due to the preferential etching of defects, and then dividing by the area of the slice. As FIG. 7 shows, the areal density of planar defects measured in a slice near the original seed crystal will generally be higher than the areal density measured near the crown. Thus, to get the true areal planar defect density (and, thus, determine the number of low defect wafers that can be sliced from the boule) a slice from the boule is preferably selected from near the seed side of the boule. The areal densities of planar defects in wafers or seed plates sliced from a boule may be measured in the same way. High-resolution x-ray diffraction (XRD) rocking curves are a commonly used indication of the crystal quality and may be used to estimate the dislocation density. See Lee et al., "Effect of threading dislocations on the Bragg peakwidths of GaN, AlGaN, and AlN heterolayers," Appl. Phys. Lett. 86, 241904 (2005), incorporated by reference in its entirety. Based on this paper, it can be estimated that to obtain less than 50 arcsec full width at half maximum (FWHM) for a triple-crystal x-ray rocking curve of the (0002) reflection (for a c-face wafer), the areal planar defect density is preferably below 100/$cm^2$.

The yield from a boule (the number of wafers that can be sliced from the boule that meet the size and defect specification) may be increased by reducing the areal density of planar defects in the boule and by increasing the length of the boule. Preferably, a technologically useful boule yields at least 5 wafers that meet the size and defect specifications.

1. Preparation of the Seed Crystal

In the implementations discussed below, a high quality AlN seed crystal is prepared. The AlN seed crystal is preferably cut from a single-crystal boule grown as described herein (i.e., a portion or all of a resultant boule is used to form seed plates for subsequent crystal growth). Typically the seed crystals are cut as round plates of about 2 inches (50-60 mm) in diameter and having a thickness ranging from 0.2 up to 5.0 mm. However, smaller area seeds may also be prepared to be able to select seeds formed from very high quality regions of a boule of nonuniform quality or because a different crystal orientation is desired. These smaller diameter seeds may be mined from AlN crystal boules grown as described herein. Seed plates or smaller area seed crystals may also be prepared by slicing AlN boules fabricated by other techniques, such as the technique described in the '660 application where a high quality encased AlN seed crystal, formed by self nucleation, is used to seed the AlN crystal growth and the crystal growth crucible is arranged so as to expand the diameter of the resultant AlN boule up to 2 inches in diameter, as shown in FIG. 7 of that application. In all cases, it is important that high quality, nearly defect free seeds be selected, because defects in the seed crystal(s) may be duplicated in the AlN boule to be produced. In particular, the areal density of planar defects in the seed crystals is preferably below 100 $cm^{-2}$ and, even more preferably, below 1 $cm^{-2}$. If multiple small area seeds are to be used simultaneously, the orientation of each seed is preferably carefully controlled so that the seeds can be matched when they are mounted on the seed holder.

The orientation of the seed crystal plate (or of the smaller seed crystals) is typically with the c-axis parallel to the surface normal of the plate (a so-called c-axis seed plate), but other orientations and sizes are suitable as well. The surface of the AlN seed crystal that will face the seed holder assembly (the seed back side) is preferably smooth and flat with a total thickness variance (TTV) of less than 5 μm and preferably less than 1 μm so that gaps between the seed crystal and the seed holder assembly are reduced. A "smooth surface," as used herein, is a surface that has no scratches visible when viewed with an optical microscope under 200× magnification and that the root mean square (RMS) roughness measured with an atomic force microscope (AFM) is less than 1 nm in a 10×10 µm square area. Optical measurement techniques are effective for measuring the TTV.

The top surface of the AlN seed crystal (which will serve as the nucleation site of the AlN crystal boule) is preferably smooth. In addition, any crystal damage in the top surface of the AlN seed crystal that may have resulted from cutting or polishing the seed crystal is preferably removed prior to attaching the seed crystal to the seed holder. This subsurface damage (SSD) layer may be removed in accordance with methods described in U.S. Ser. No. 11/363,816 (referred to hereinafter as the "'816 application") and Ser. No. 11/448,595 (referred to hereinafter as the "'595 application"), both of which are incorporated herein by reference in their entireties. An exemplary method includes performing a CMP step by applying an abrasive suspension in a solution consisting essentially of a hydroxide. Another exemplary method is a CMP process that includes polishing a substrate using a slurry including an abrasive suspension in a solution capable of modifying the surface material of the substrate and creating a finished surface suitable for epitaxial growth. The active solution chemically modifies the surface of the substrate, forming a compound softer than the underlying substrate material. The abrasive is selected to be harder than the newly created compound, but softer than the substrate material, so that it polishes away the newly formed layer, while leaving the native substrate surface pristine and highly polished.

The specific recipe for SSD removal depends on the seed orientation. Removal of the SSD layer is important as it preferentially thermally etches, leaving void and defect spaces as well as irregular topography at the interface between the seed crystal and the resulting AlN boule that may compromise crystal growth and may result in planar defects. In particular, improvements in polishing of the seed crystal may improve the quality of the boule growth by reducing defects during thermal cycling. A suitable seed will have planar and/or extended voids of less than 1 per square centimeter intersecting either surface of the seed, less than one scratch of 10 nm depth within a 10×10 µm square AFM scan and less than one crack per $cm^2$.

Other defects that are preferably avoided include pits, grain boundaries (including polarity inversions) and cracks. In addition, surface contamination due to, for instance, polishing, handling, and oxidation, is undesirable. Void formation from the inclusion of scratched material is a risk. Areas with SSD are more likely to thermally etch during the seed mounting heating cycle. Thermal etching of the AlN seed crystal or backing material may create a void space. In addition, SSD represents damaged crystal lattice within the seed crystal. Defective crystal lattice within the seed crystal is generally replicated within the grown boule and may lead to the creation lower quality wafers that are cut from that boule. Thermal etching of the seed crystal may be mitigated by using a lower mounting temperature (lower mounting temperature may reduce thermal etching) or by gas species/pressure choices (high pressure $N_2$/argon/xenon, etc. may suppress thermal etching) but may leave SSD that will be replicated in the seeded growth.

Voids present in the seed material may create voids in the grown boule. Voids intersecting the back surface of the seed may lead to seed mounting difficulties. Voids intersecting either the seed holder or growth interface surface of the seed may present contamination issues (trapped material). Therefore, seeds for seeded growth desirably are either cut from boules that have been grown by these void-free methods or cut from AlN boules generated by self-nucleation techniques described in the '660 application.

In particular, as discussed in the '660 application, two conditions may be considered to employ self-nucleation in the preparation of AlN boules. First, there is a nucleation barrier to the growth of AlN on tungsten. That is, the vapor above a tungsten crucible tends to be supersaturated unless AlN nuclei are available for growth. To take advantage of this, a seeded region may take up some part of the full diameter seed mounting plate that is surrounded by an unseeded, bare region. Since adsorption of aluminum and nitrogen from the vapor onto the seed is favored over deposition onto the bare crucible wall, the seed is favored to expand laterally in favor of creating new self-seeded critical nuclei next to the seed. Under properly controlled conditions this process can be used to increase the seeded area per growth cycle. Secondly, the process of crystal growth requires heat extraction which is controlled by arrangements of insulators/heaters in the system. Properly arranging insulation so that the seed is the coolest part of the upper crucible and cooler than the source during growth is important to the process. Further tailoring this insulation when using a small seed to be expanded during the growth aids in expansion of the seed by making the seed cooler than the unseeded lateral region. This thermal arrangement makes self-seeded nucleations neighboring the seed less favored by limiting heat extraction. As the crystal grows at high temperature and with sufficient source material, given sufficient time to reach an equilibrium point during the growth run the interface of the crystal will follow the isotherms of the system (insulation/heaters, etc). The proper interface shape to favor seed expansion is slightly convex in the growth direction; the curvature of the gradient aids expansion.

Residual SSD may be identified and other defects such as threading dislocations (TDD) may be revealed with a defect etch using a KOH vapor/solution or with a KOH-enhanced CMP, as described in Bondokov et al. in "Fabrication and Characterization of 2-inch Diameter AlN Single-Crystal Wafers Cut From Bulk Crystals" [Mater. Res. Soc. Symp. Proc. Vol. 955 (Materials Research Society, Pittsburg, 2007) p. 0955-103-08]. The density of the pits measured in these defect etches is referred to as etch pit density (EPD). For seeded growth, it is generally desirable to start with seeds that have less then $10^4$ EPD. It is possible to improve grown boule over seed quality, but it is preferable to start with high quality seeds. It is also important to avoid cracking the seed.

2. Detailed Example of a Seed Crystal Preparation

The procedure used to prepare the seed crystal surface depends on its crystallographic orientation, as described in the '816 application and '595 application. Briefly, as described in those applications, crystallographic orientation affects mechanical preparation of a substrate surface prior to CMP processing; substantial differences exist for optimal substrate preparation. For example, in the case of an AlN substrate, the Al-terminated c-face is not reactive with water, but the N-terminated c-face is reactive with water, along with non-polar faces. During wet lapping and polishing, the Al-polarity face tends to chip under the same conditions that are well-suited to mechanically polish the non-Al-polarity faces or Al-polarity faces where the c-axis is oriented 20 degrees or more away from the surface normal of the substrate.

Here, we describe an exemplary process for preparing a c-axis seed plate where the nitrogen-polarity face (N-face) will be attached to the seed holder assembly and the aluminum-polarity face (Al-face) will be used to nucleate the AlN boule. After an appropriately oriented seed plate is cut from an AlN boule using a diamond wire saw (the seed plate is cut such that the c-axis is within 5° of the surface normal), the surfaces are ground flat and then diamond slurries (with progressively decreasing diamond size) are used successively to further mechanically polish both surfaces of the seed plate. More specifically, the N-face of the as-sliced AlN wafers undergoes grinding (with 600 diamond grit), lapping (6 μm diamond slurry), and fine mechanical polishing with 1 μm diamond slurry. Then, the wafer is flipped over and the Al-face undergoes grinding (with 600 and 1800 diamond grit), lapping (6 μm and 3 μm diamond slurries), and fine mechanical polishing with 1 μm diamond slurry followed by the CMP, as described in the '816 application where a high pH silica suspension in a KOH solution is used to leave an Al-polarity, c-face surface that is free of SSD.

These mechanical polishing steps may be followed by a CMP step on the N-face of the seed crystal (which is the back surface that will be mounted facing the seed holder assembly in this example). A suitable slurry is a 1 μm $Al_2O_3$ slurry with active chemical solution (the slurry is made of 100 grams of 1 μm $Al_2O_3$ grit per 1 liter of solution composed of 0.5M KOH in distilled water (1 liter) with an additional 50 mL of ethylene glycol). The slurry is used on a soft composite iron polishing deck such as the AXO5 from Lapmaster, Inc.), leaving the surface highly reflective to the eye and free of defects such as scratches or pits or open cracks. The grit choice and active chemical reaction between the AN and the strong base (KOH) are important for producing a surface with low defect densities. A preferred surface has less than 1 scratch deeper than 10 nm per 10 square μm scan with an AFM and the RMS roughness measured with an AFM is less than 1 nm in a 10×10 μm area. In addition, the back side of the seed crystal surface preferably has a TTV of less than 5 μm and more preferably less than 1 μm. This is important because surface topography, even at a microscopic level, may result in planar defects forming in the seed crystal; these defects may propagate into the crystal boule during subsequent growth. The flatness of the polished surfaces is checked using a suitable optical flat and monochromatic light source (sodium lamp at 590 nm).

The Al-face is then subjected to a final CMP step after the 1 μm diamond polishing step using a silica suspension from Cabot Industries (Cabot 43). Additional techniques for preparing the surface of the seed crystals are described in the '816 application and the '595 application. For example, as noted above, the CMP process may include polishing a substrate using a slurry including an abrasive suspension in a solution capable of modifying the surface material of the substrate and creating a finished surface suitable for epitaxial growth. The active solution may modify the surface of the substrate, forming a compound that is softer than the underlying substrate material. The abrasive may be selected to be harder than the newly created compound, but softer than the substrate material, so that it polishes away the newly formed layer, while leaving the native substrate surface pristine and highly polished. In some CMP processes, the slurry may include an abrasive suspension in a solution consisting essentially of a hydroxide.

The seed crystal is now ready for mounting on one of the seed mounting assemblies described below and is preferably carefully stored in a nitrogen atmosphere glove box to avoid any contamination prior to growth.

3. Seed Holder Plates

Different structures have been developed for the seed holder plate. The preferred approach depends on the particular circumstances used for crystal growth.

3.1. Textured AlN Deposited on a Backing Plate

Figure 8:
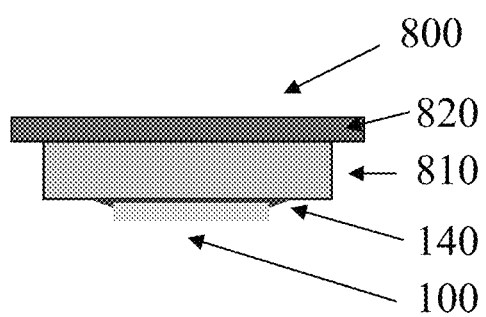
FIG. 8 is a schematic diagram illustrating the bonding of an AlN seed to a seed holder, (which, in a preferred implementation, consists of an AlN foundation on a W backing plate)

Referring to FIG. 8, in an embodiment, a seed holder may include a relatively thick, highly textured AlN layer, i.e., foundation 810, deposited on a metal backing plate 820, e.g., W foil. The holder 800 is sized and shaped to receive an AlN seed therein. Preparation of a preferred embodiment may include one or more of the following three features:

a.) The use of a seed holder including an AlN foundation bonded to an appropriate backing plate (in a preferred embodiment, this backing plate is W foil);

b.) Appropriately conditioning the backing plate so that it is nearly impervious to Al diffusion through the plate; and/or c.) Using Al foil to form an adhesive 140 to bond the seed to the AlN ceramic or seed plate by heating the seed plate/Al foil/AlN seed crystal to high temperature rapidly enough so that the Al first melts and uniformly wets the AlN with a very thin layer of Al before converting into AlN.

In an embodiment, the W foil has a thickness of 20 mils to 5 mils (510 to 130 μm). A thinner W foil may be desirable to reduce the stress that the seed plate will apply to the seed crystal and the resulting boule due to the thermal expansion mismatch between the AlN and seed mounting W plate. The thickness of foil used for the mounting plate may be chosen such that the specific vendor/lot of W-foil provides a relatively impervious barrier to aluminum and/or nitrogen. This W-backing or barrier layer is preferably made from high density material (for tungsten >98% theoretical density) and may be made of multiple layers of grains allowing grain swelling to close fast diffusion paths between grain boundaries. The latter approach has also been described in U.S. patent application Ser. No. 11/728,027 (referred to hereinafter as the "'027 application"), incorporated herein by reference in its entirety. As discussed therein, machining of powder metallurgy bars including tungsten grains having substantially no columnar grain structure is an exemplary method of forming multilayered and/or three-dimensional nominally random tungsten grain structures that can help prevent permeation of aluminum through the tungsten material. In addition, this W backing plate may be made from single crystal tungsten, that may not have any grain boundary diffusion.

The W foil is preferably cleaned and conditioned with aluminum prior to crystal growth. The foil may be further conditioned by applying additives such as Pt, V, Pd, Mo, Re, Hf, or Ta. Thicker layers of tungsten may be used to limit Al diffusion through the backing plate but they will suffer from increased thermal expansion mismatch between the materials leading to higher cracking densities in the grown AlN crystals.

The polycrystalline W foil is preferably made of layers of grains. These stacked and compressed pure W-grains contain path ways between the grains (where the grains meet neighboring grains) that allow diffusion paths between the grains. Loss of aluminum is primarily through these grain boundaries and leads to voids (planar or extended) in the AlN. In time, as these W grains absorb Al atoms through diffusion into the W grains, the W grains will swell as much as 5%, as Al is a substitutional impurity in W and has approximately a 5% solubility. As detailed in the '027 application, these swollen grains will decrease the grain boundary diffusion rate. The Al-conditioning may be achieved at growth temperature by processing similarly to the described AlN-foundation process. Rather than using Al to condition the W foil, other materials such as Pt, V, Pd, Mo, Re, Hf, or Ta may be used to decrease the amount of Al lost through grain boundaries by swelling, filling or decreasing the grain boundary density in the W backing plate.

In the cases of Pt, V, or Pd, the elements may be applied (painted, sputtered, plated or added as foils) to the W foil and run through a heating cycle, preferably above the melting point of the added material but below the melting point of the tungsten, to allow the added element to melt, leading to reaction with the W grains. This tends to cause the W grains to swell and to decrease both the time and Al required to further swell the grains and reduce Al losses through grain boundary diffusion.

In the cases of Mo and Re, the elements may be mixed with the W to form an alloy. These alloys have a lower eutectic point with the Al present under growth conditions. This means that backing material composed of these alloys may not be suitable at as high a growth temperature as pure tungsten. The lower eutectic point means that exaggerated grain growth tends to be faster than pure W with the same Al exposure conditions. While care must be taken to ensure that there are enough layers of grains in these alloy foils, the surface layers of grains will quickly swell on exposure to Al vapor, which will prevent further Al diffusion along the their grain boundaries. An additional advantage of Mo and Re alloys with tungsten is that these alloys may have a smaller thermal expansion mismatch with AlN, which will improve the cracking yield (i.e., fewer boules will be cracked).

In the cases of Hf and Ta, the applied layers on the W-foil may be reacted to form additional film or barrier layers on the W foil which will help to fill the grain boundaries in the W foil. The Hf or Ta can be applied to the W-foil surface by adding powder, foil, sputtering or plating. The pure element spread over the polycrystalline W foil can then be reacted with nitrogen or carbon to form HfN, HfC, TaC or TaN which will aid in sealing grain boundaries and will reduce the grain boundary diffusion rate through the W foil. These nitride or carbide compounds could be applied directly as well provided they could be applied in continuous layers forming a minimum of additional pathways or grain boundaries through the layer.

Figure 9:
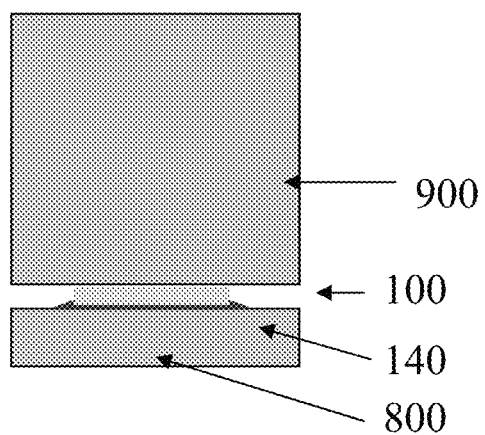
FIG. 9 is a schematic diagram illustrating the technique for bonding an AlN seed crystal to a seed holder, which, in a preferred implementation, uses Al-foil nitridation.

Referring to FIG. 9, a single-crystal seed 100 is attached to a seed holder 800 using a weight 900. The single-crystal seed 100 attached to the seed holder 800 by, e.g., adhesive 140. The important elements of this approach are: (i) that the AlN foundation, if properly formed, provides a nearly perfect thermal expansion match to the growing AlN boule as well as an excellent chemical match; (ii) the backing plate, when properly conditioned, provides a nearly impervious barrier to Al diffusion; and (iii) the rapid thermal processing of the Al foil along with excellent polishing of the AlN seed and the AlN foundation, provides a tight and dense bond between the foundation and the seed that will help prevent planar defects from forming.

4. Preferred Implementations

In a preferred embodiment, a polycrystalline AlN foundation is produced by the sublimation-recondensation technique described in the '660 application, in which a relatively thick (3 to 5 mm) layer of AlN material is deposited directly onto a metal foil or plate. The process includes sublimation, wherein the source vapor is produced at least in part when crystalline solids of AlN or other solids or liquids containing AlN, Al, or N sublime preferentially. The source vapor recondenses on a growing seed crystal. It may be desirable to have the thickness of the AlN deposit be more than 10 times the thickness of the metal plate so that the relative stiffness of the AlN layer substantially exceeds that of the metal plate. In this manner, the majority of the strain from any thermal expansion mismatch between the metal plate and the AlN foundation plus seed crystal (plus crystal boule after growth) may be taken up by the metal plate. It may be desirable to not have the thickness of the foundation layer be too large, because a greater thickness may limit the size of the eventual crystal boule to be grown. For this reason, the thickness is preferably limited to less than 20 mm. We have found that deposition of the AlN under typical growth conditions described in the '660 application can result in a highly textured AlN film. In this context, a textured film means that almost all of the AlN grows in the form of grains having a c-axis (the [0001] direction using standard notation for hexagonal crystals) oriented parallel to the surface normal of the growing film. The diameter of the grains in the plane perpendicular to the growth direction (i.e., perpendicular to the [0001] crystallographic direction) is typically 0.1 to ~2 mm in size. An advantage of this highly textured film is its beneficial impact, derived from the fact that AlN has various thermal expansion coefficients that depend on the crystallographic direction. A polycrystalline film where the individual grains were randomly oriented may crack as it is cycled from the growth temperature of approximately 2200° C. to room temperature.

While the AlN is being deposited on the W foil, the surface of the W foil may become saturated with Al which, we have observed, will greatly reduce further diffusion of Al through the foil. This phenomenon is described in '027 application, where it is noted that the penetration rate of aluminum along grain boundaries is reduced after the tungsten grains have swelled due to uptake of Al by bulk in-diffusion. It may be desirable to form the polycrystalline W foil so that it contains multiple layers of W grains. We have found that W foil that is 0.020 to 0.005 inch thick (e.g., material supplied by Schwarzkopf, H C Starck, H Cross) is satisfactory for this purpose. Other metal foils or plates are also suitable; these include Hf, HfN, HfC, W—Re(<25%), W—Mo(<10%), pyrolitic-BN (also called CVD-BN), Ta, TaC, TaN, Ta$_2$N, carbon (vitreous, glassy, CVD, or POCO) and carbon coated with Ta/TaC, Hf/HfC and BN. We have also found it helpful (depending on the grain structure of the foil) to precondition the W foil by exposing it to Al vapor and letting the surface layer saturate with Al prior to significant deposition of the AlN layer on top of the foil.

Following growth and cool down of the polycrystalline AlN layer on the backing material (or as-grown foundation), the foundation may be inspected to determine the suitability of the as-grown foundation for further use in seed mounting. In some embodiments, suitable AlN foundations exhibit no or low cracking (<1 crack per square cm), no or low planar voiding (<1 planar intersecting the surface per square cm), and no or low areas of thin AlN deposition (sufficient grown thickness to polishing to specification). Inclusion of cracks, voids or thin layers behind the seed mount area may create void space behind the seed crystal. This void space may migrate, as described previously, to deteriorate the seed crystal and grown AlN boule.

In the described configuration, the AlN foundation layer may act to reduce the forces from thermal expansion mismatch on the grown boule by matching the thermal contraction of the grown AlN boule. The holder plate (backing layer of W-foil) acts as the layer that is relatively impervious to aluminum and/or nitrogen barrier layer preventing migration of the crystal material leading to void formation.

After the AlN layer is deposited as described above, it is preferably polished to a smooth and flat surface. As mentioned above, a "smooth surface" in this context means that there are no visible scratches in an optical microscope (200× magnification) and that the root mean square (RMS) roughness measured with an atomic force microscope (AFM) is less than 1 nm in a 10×10 µm area. This is important as surface topography, even at a microscopic level, may result in planar defects forming in the seed crystal; these defects may propagate into the crystal boule during subsequent growth. The flatness of the polished foundation surface may be checked using a suitable optical flat and monochromatic light source (sodium lamp at 590 nm is typical). The foundation surface is preferably flat across the seed area to better than 5 µm and preferably better than 1 µm. The as-grown AlN foundation layer on the W seed backing foil is polished in the manner of a fine mechanical preparation of a single-crystal AlN substrate, e.g., as described in '816 application. In an exemplary CMP process, substrate may be polished with a slurry including an abrasive suspension in a solution, such that the slurry is capable of etching the substrate surface and creating a finished surface suitable for epitaxial growth. A silica suspension in a hydroxide solution may be used, e.g., the KOH-based CMP slurry known in the art as SS25 (Semi-Sperse 25) available from Cabot Microelectronics or the Syton slurry available from Monsanto. The W foil backing side of the AlN/W foundation (as grown) may be mounted to a polishing fixture using a suitable mounting adhesive (e.g., Veltech's Valtron—AD4010-A/AD4015-B—50CC thermal epoxy). The rough shape of the composite may be leveled by polishing the AlN layer using a rough mechanical step. A suitable approach is to use a 15 µm diamond slurry on a steel polishing deck (e.g., a Lapmaster 12" or an Engis LM15 with a regular steel deck). This rough mechanical step may be followed by a fine mechanical process with 1 µm $Al_2O_3$ slurry in a KOH solution (the slurry is made of 100 grams of 1 µm $Al_2O_3$ grit per 1 liter of solution which is composed of 0.5M KOH in distilled water (1 liter) with an additional 50 mL of ethylene glycol). The composite is polished with this slurry on a soft composite iron polishing deck such as the AXO5 from Lapmaster, Inc.), leaving the surface highly reflective to the eye and free of defects such as scratches or pits or open cracks. The grit choice and active chemical reaction between the AlN and the strong base (KOH) is important to produce a surface with low defects. The preferred surface has less than 1 scratch deeper than 10 nm per square 10 µm scan (AFM) and TTV of less than 5 µm across the seeded area. In addition to providing this flat, scratch-free surface, the chemical reactivity of the solution and low hardness (with respect to AlN) of the grit and deck material provides sufficiently low SSD to avoid thermal etching the AlN foundation.

Following a suitable polishing process, the foundation is chemically cleaned of polishing residues prior to the described seed-mounting stages involving the foil and seed.

4.1. AlN-to-AlN Bonding Using Al Foil Nitridation

The AlN seed is now bonded to the AlN foundation using Al foil nitridation. The Al foil is placed between the seed and the foundation, and is heated up to temperatures sufficient to nitride the whole Al foil and thus produce a thin AlN bonding film between the AlN seed and AlN foundation. In other words, the Al foil is interposed between the seed and the foundation, and melted to uniformly wet the foundation with a layer of Al. The Al foil nitridation has the advantages of cleanliness and producing a microscopically conformal coverage of the seed backside, resulting in low planar-defect densities. The density and chemical stability of any backing material used to protect the seeds are important. If the backing material is not chemically stable (e.g., against Al vapor), then the resulting reaction between the Al vapor and the backing material may result in decomposition and thus voiding. If the backing material is not dense enough, the Al vapor can sublime through it, leaving behind extended voids and/or planar defects. If the backing material has a high vapor pressure at AlN crystal growth conditions, then it will migrate allowing void formation and will possibly become a boule contaminant. A schematic diagram of this structure is shown in FIG. 8.

AlN seeds are known to form oxides and hydroxides during exposure to air, moisture and during chemical cleaning (hydrous and anhydrous chemicals contain enough water to react given AlN properties). As such, the prepared and cleaned seed surfaces may have some reproducible layer of oxides or hydroxides present during seed mounting. One advantage of using a liquid flux (the aluminum metal is melted and remains a liquid before forming a nitride and becoming a solid during the described process) is that the liquid will dissolve the seed surface oxide prior to reaction and convert the oxide into a more stable form and/or distribution. A layer of oxide and/or hydride on the seed surface may have a high vapor pressure under growth conditions and may lead to void formation. The more chemically reactive side of the AlN c-axis wafer (the N-face) will have hydroxide formation that may be >10 nm in thickness.

The starting materials for an exemplary process are a polished AlN foundation seed holder, polished AlN seed crystal, and Al foil (10 mil thick from Alfa Aesar). First the materials are cleaned to produce reproducible and clean surfaces. The AlN foundation seed holder, prepared as described above, is treated as follows:

1. $HCl:H_2O$ [1:1] boil to remove polishing residues (20 min)
2. distilled water rinse
3. Room temperature HF (49% solution) dip (15 min)
4. Anhydrous Methanol rinse 3 times
5. Store under anhydrous methanol while assembling seed mount.
6. Dry carefully to avoid solvent stains upon removal from the anhydrous methanol.

The AlN seed crystal (after preparation as described above) is treated as follows:

1. HCl boil to remove remaining epoxy residues from boule processing (20 min)
2. Room temperature HF (49% solution) soak to remove $SiO_2$ and polishing residues (15 min) and surface oxide/hydroxide layers.
3. Anhydrous methanol rinse 3 times
4. Store under anhydrous methanol while assembling seed mount
5. Dry carefully to avoid solvent stains upon removal from the anhydrous methanol.

The Al foil is treated as follows (Al-foil: 10 µm thick, 99.9% purity foil provided by Alfa Aesar is preferred embodiment):

1. Cut to square sufficient to cover the seed area
2. Drip (1 min) in $HF:HNO_3$ solution (RT) for 1 min—removes oil and oxides
3. Anhydrous methanol rinse 3 times
4. Store under methanol while assembling seed mount
5. Dry carefully to avoid solvent stains upon removal from the anhydrous methanol.

With cleaned components:

1. Remove foundation from anhydrous methanol
2. Remove Al-foil from anhydrous methanol
3. Place foil dull side down and smooth side up onto the foundation
4. Smooth any air bubbles from behind the foil so that the thin/soft foil is void free on the foundation.

5. Remove the seed from the anhydrous methanol
6. Place seed (polarity determined) onto the foil
7. Trim excess foil from around the seed with a clean razor blade.

The seed, foil, and foundation are stacked into the furnace (inverted from the orientation shown in FIG. 8 to obtain the orientation shown in FIG. 9, so that gravity holds the seed and foil down on the foundation). Clean W weights 900 are then stacked on the seed to ensure that, during the melt phase, the seed is pressed toward the mount surface to reduce gaps. In an exemplary embodiment, about 0.6 kg of W mass per 2" wafer. The W weights are cleaned prior to use by heating in a furnace in a reducing atmosphere (typically forming gas is used with 3% hydrogen) to a temperature higher than the seed-mounting temperature for several hours and polished flat by mechanical polishing processes similar to the foundation and seed process/equipment.

Once the stack of weights, seed, foil, and foundation are positioned in the furnace, the station is evacuated to base pressures <$10^{-4}$ mbar, preferably <$10^{-6}$ mbar and refilled with clean gas (filtered UHP grade forming gas (3% $H_2$ and 97% $N_2$).—lower than 1 ppm impurity of moisture, oxygen, hydrocarbons). Preferably, a station is used that is capable of high purity gas flow through the reaction zone where the seed is mounted. The flow gas tends to act as a curtain of clean gas, keeping chamber contamination away from the seed mount area. Contamination of the seed mount process may lead to the formation of oxides, carbides, materials other than pure AlN, and pure seed backing material may introduce unstable species that may migrate during crystal growth, leaving space that may allow void formation. Seed mount or bonding contamination (oxide formation) may lead to lower thermal conductivity regions behind/around the seed. Preserving consistent and high quality thermal contact around the seed and to the seed backing is important for maintaining good seeded growth. Oxides and other impurities tend to have a higher vapor species during crystal growth leading to migration/sublimation of the contaminant causing void spaces.

As mentioned above, gas flow is one way to improve the purity of the seed mount. A second way is to introduce a getter, with current best practice using both gas flow and getter materials. The preferred gettering materials are yttrium metal and hafnium metal. These act to getter the local atmosphere of contamination around the seed during mounting. The yttrium metal melts at 1522° C. (during ramp up of the Al-foil seed mounting process) and spreads to getter a wide surface area. Using a thin foil of the material tends to be most effective (e.g., Alfa Aesar, 0.1 mm thick, 99.999% purity Y-foil). Furthermore, yttrium oxide is stable under typical AlN growth conditions, meaning that it will provide only a low vapor pressure of oxide contamination back into the crystal growth environment if this getter from the seed mount remains during the growth. Hafnium-metal getter will not melt (melting point >2200° C.) under the described seed mount conditions but tends to surface react with both the oxide and the nitrogen. Therefore, the powder form of hafnium is preferred for this application (e.g., Alfa Aesar, −325 mesh, 99.9% metal basis purity). Each of these getters can be cleaned prior to use or purchased in sufficient purity to be used for the described application (99.9% or purer is current practice).

In each case, getter materials are placed around the periphery of the seed mounting area at the edges of the seed holder to avoid impurities from entering the seed bonding reaction zone.

In the case of hafnium powder, the hafnium will readily nitride under the described process. The HfN layer created in at the powder level or at higher temperatures (when the Hf melts and spreads at 2205° C.) forming a HfN layer. It has been observed that the HfN layer acts to prevent W-components from sticking together, even following long heating cycles with Al-vapor present. This property allows surfaces to be prepared that will not stick together, despite being well polished and very clean in the hot/reducing atmosphere.

After these steps, the seed mounting setup is ready for the heating cycle. In a preferred embodiment, the seed-mount stack is rapidly heated (<5 minutes) to approximately 1600° C. and ramped in 30 minutes to 1650° C. The purpose of this is to quickly melt the Al foil and to allow the Al liquid to readily flow with low surface tension, allowing the Al melt to readily wet the AlN seed crystal and the AlN foundation uniformly, i.e., melting the Al foil to uniformly wet the foundation with a layer of Al. A high density AlN between the original seed crystal and the AlN foundation is formed. Allowing the heat-up cycle to remain at low temperatures (below about 1100° C.) for too long may permit the liquid Al to bead up and form a porous AlN ceramic when the Al starts to nitride, thereby creating void spaces behind the seed. Once at 1650° C., the temperature is held for >1 hour to allow the Al-melt to fully nitride, forming a high-density AlN ceramic that is bonded to the seed and to the AlN foundation. Following the >1 hour soak at 1650° C., the station is ramped to room temperature in an additional 2 hours.

Figure 10:
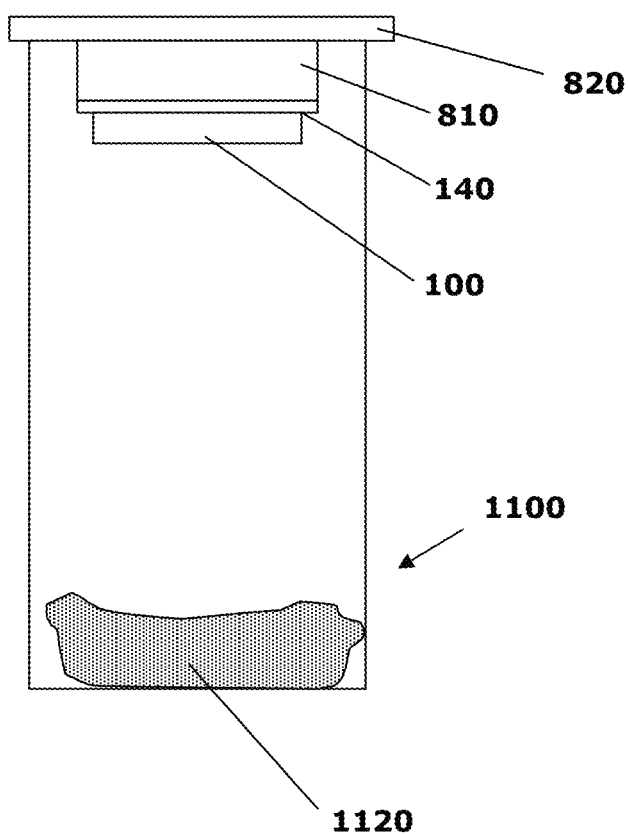
FIG. 10 is a schematic diagram illustrating an assembled crystal growth crucible.

Following this heat cycle/nitride mounting, remaining getter materials and seed mounting weight 900 are removed from the assembled seed-seed holder. The seed and seed holder assembly is now ready to be inverted as shown in FIG. 8 and assembled for the crystal growth cycle. The crystal growth crucible is assembled as shown in FIG. 10. In particular, AlN seed 100 and seed holder assembly (including adhesive 140, foundation 810, and backing plate 820) are assembled as shown in a crystal growth crucible 1100. The AlN seeded bulk crystal growth may be carried out in a tungsten crucible 1100 using a high-purity AlN source 1120. The AlN seed 100 is mounted onto the seed holder assembly as described above.

Single-crystal aluminum nitride is formed by depositing aluminum and nitrogen onto the AlN seed 100 under conditions suitable for growing single-crystal AlN originating at the seed. For example, growth may be initiated by heating the crucible with the seed mount and source material to a maximum temperature of approximately 2300° C. and with a gradient of less than 50° C./cm as measured radially and a vertical gradient greater than 1° C./cm but less than 50° C./cm. During the initial ramp-up to the growth temperature, it may be desirable to position the seed crystal and the source material such that they are at approximately the same temperature (the seed equilibrium position) so that any impurities on the surface of the seed crystal are evaporated away prior to growth. Once the growth temperature is achieved, it may be desirable to either move the crucible assembly so that the seed is temporarily hotter than the source material, or to temporarily reduce the nitrogen partial pressure prior to initiating growth on the seed crystal in order to evaporate part of the surface of the seed crystal. The partial pressure of nitrogen in the furnace may be reduced either by reducing the total pressure of gas in the furnace or by adding an inert gas, such as Ar, to the furnace while keeping the total pressure in the furnace constant.

The bulk single crystal of AlN formed by this method may have a diameter greater than 20 mm, a thickness greater than 0.1 mm, and an areal defect density ≤100 cm$^{-2}$. The method may enable the formation of bulk single crystal AlN in the form of a boule having a diameter greater than 20 mm, a thickness greater than 5 mm, and an areal density of threading dislocations ≤10$^6$ cm$^{-2}$—or even ≤10$^4$ cm$^{-2}$—in each cross section of the bulk single crystal disposed in a plane perpendicular to a growth direction of the crystal. A boule may include a bulk single crystal of AlN having a sufficient thickness to enable the formation of at least five wafers therefrom, each wafer having a thickness of at least 0.1 mm, a diameter of at least 20 mm, and a threading dislocation density ≤10$^6$ cm$^{-2}$, preferably ≤10$^4$ cm$^{-2}$.

A boule formed by methods described herein may be a substantially cylindrical bulk single crystal of AlN having a diameter of at least 20 mm and having a sufficient thickness to enable the formation of at least five wafers therefrom, each wafer having a thickness of at least 0.1 mm, a diameter of at least 20 mm, and a triple-crystal X-ray rocking curve of less than 50 arcsec FWHM for a (0002) reflection, with each wafer having substantially the same diameter as each of the other wafers.

4.2 Multiple Seed Mounting

It may be desirable to mount several seeds on the AlN ceramic simultaneously. For instance, it may be difficult to obtain seed crystals large enough, with sufficiently high quality, to cover the entire area of the AlN ceramic. In this case, it may be desirable to use multiple seeds that may be mounted on the AlN ceramic simultaneously. This may be accomplished by preparing seed crystals as described above, all with the same orientation. The seed crystals may then be mounted on the AlN ceramic on the metal backing plate as described above (or other seed holder assemblies as described below) with careful attention to aligning their azimuthal axis. In the case of smaller seeds, it is possible to expand a seed within a growth run using thermal gradients. The laterally expanded seed crystal generally avoids the seed mounting source of planar voids but may still require a low porosity seed backing barrier to avoid through voiding formation of planar defects within the grown boule. In addition, it may be possible to arrange a patch work or mosaic of small seeds accurately enough so that the resulting large diameter boule is grown with suitable orientation between the smaller seeded regions to produce a congruent 2" wafer. For c-axis AlN seeded growth, the alignment of the seeds is preferably accomplished by preparing the seed crystals with m-plane cleaved edges. The AlN cleaves on the m-plane to produce very straight edges perpendicular to the c-axis. Thus, the seeds may be well oriented with respect to each other by aligning the flat m-plane cleaves against the neighboring seed sections. From a small seed mosaic approach, a fraction of the 2" wafer usable area may easily be produced, but it may also be possible to seed the entire 2" area by this method. A particularly important example of using more than one seed crystal is when a 2" seed crystal is cracked and this seed crystal is mounted with the two halves aligned precisely for boule growth. By using this m-plane cleave face alignment approach to c-axis seeded growth it is possible to achieve <0.5 deg m-plane and c-axis crystallographic alignment. Because of the difficulty in obtaining seed crystals that are all exactly aligned and the difficulty in avoiding some error in the aligning of the azimuthal axes, this approach typically produces a higher defect density than a single seed crystal. However, this approach may be used to obtain larger AlN crystal boules with smaller seed sizes.

4.3 Additional Approaches that may be Used to Supplement the Preferred Implementations

4.3.1 Protection of the AlN Seed Using Relatively Impervious Films

The back of the AlN seed may be protected by depositing a high-temperature, relatively impervious material like W. This barrier layer can be deposited by sputtering, CVD, ion deposition or plating (for conductive substrates). Plating may be used to initiate or thicken the deposited layer of seed back sealant once initial deposition has been performed. For instance, the back of the AlN seed can be protected using W film sputtered onto the back of the AlN seed and then mounted to the seed holder using any of the techniques described above. The back of the AlN seed may also be protected by attaching it (with an adhesive such AlN which is formed by nitriding a thin foil of Al as was described above) to W foil. The W foil may be single crystal to reduce Al diffusion. The density of the planar defects is then reduced significantly. Other materials expected to posses suitable properties to be used as relatively impervious barriers include: Hf, HfN, HfC, W—Re(<25%), W—Mo (<10%), pyrolitic-BN (also called CVD-BN), Ta, TaC, TaN, Ta$_2$N, Carbon (vitreous, glassy, CVD, POCO) and carbon coated with Ta/TaC, Hf/HfC and BN. The key attributes of a suitable material to be deposited on the back surface include:

a. Temperature stability (>2100° C.)
b. Chemically stable in growth environment (Al-vapor, N$_2$, H$_2$)—vapor pressures <1 mbar at temperatures >2100° C. in N$_2$, N$_2$-H$_2$(<10%), Ar, around 1 atm pressure.
c. Low diffusivity of Al through the backing material by being physically impervious to gas flow (generally this means that the material is dense without voids) and having a small diffusion constant for Al. Since diffusion along grain boundaries is generally much higher than diffusion through grain boundaries, it may be desirable to have the grains swell so as to become more dense as Al diffuses into the material ("self-sealing" grain swelling as described in the '027 application.)

The material may, for example, be exposed to Al vapor prior to use as a seed holder plate to limit Al diffusivity through grain swelling in the plate. At typical growth temperatures, the vapor pressure in the growth atmosphere is about 0.1 bar Al-vapor and the equilibrium (atom-wt-%) Al level in W has been measured to be ~5%, so the preferred backing will have no voids, will not evaporate or migrate during the run, and will have its surface pre-saturated with the equilibrium Al-content for that material at the anticipated growth temperature.

4.3.2. Growth of Bulk AlN Single-Crystals Along Off-Axis Directions

The AlN bulk crystal may be grown parallel to directions at least 15±5° off-axis. The off-axis growth include crystal growth with interface parallel to non-polar {1 $\bar{1}$ 00} and semi-polar planes {10 $\bar{1}$ 1}, {1 $\bar{1}$ 02}, and (10 $\bar{1}$ 3). In the case of non-polar growth, the growth rate of the crystallographic planes differs from the growth rate of the same planes when crystal is grown on-axis or slightly off-axis. Therefore, even though the back surface of the seed may not be perfectly protected, planar-defect formation may be resolved into generation of other defects, e.g., stacking faults, twinning, etc., to reduce its impact.

4.3.3 Protection of the Back of the Backing Plate (Outer Sealing)

In addition to mounting the AlN seed onto the seed holder as described above, the outside of the seed holder (i.e., backing plate 820 in FIG. 8), that forms the crucible lid—i.e., the side outside the crucible—may be protected to inhibit the transport of Al through the crucible lid. For purposes herein, high-temperature carbon-based adhesives, paints, or coatings may be applied. Typically these materials are applied by brushing or spraying and then thermally cycled to improve their density and structure, but they may be sputtered or electro-plated as well. For instance, if a thin (<0.005 inch) W foil is used as a crucible lid and with the AlN seed mounted on one side, then the other side of the W foil may be protected in this fashion. The advantage of protecting the outer side of the foil is that a much wider range of high-temperature materials (coating, paints, etc.) may be used as the protective layer, since there is a lower risk of interaction between Al vapor and the protective material. This approach also allows thinner metal lids to be used, which is advantageous in reducing stress on the crystal due to thermal-expansion mismatch between the lid material and AlN.

4.3.4 Seed Bond Curing in Multiple Gas Species Flow

As mentioned above, within at typical Al-foil seed mounting process, the liquid Al-foil cleans the seed surface of oxides and reacts to form $Al_2O_3$. To move to fewer voids and better quality growth, it may be necessary to more fully remove this seed oxide layer. Extending the time that the Al-foil melt is allowed to react with this oxide layer is one method for doing this. The longer Al-melt phase may be achieved by reducing the amount of nitrogen available to react with the molten Al-metal forming solid nitride. This can be performed under an argon atmosphere during heat up to suitable reaction temperature (1000 to 1800° C. depending on desired removal rate/species) and holding for sufficient time to remove oxide and hydroxide layers from the seed. Subsequently, nitrogen may be added to the flow past the seed mount zone. The nitrogen may then react with the free Al-melt and form a nitride seed adhesive.

During this molten Al phase, it is possible that the seed holder (when made of W alone) will be a diffusion membrane for the oxide species. This mechanism would allow the getter of the oxide from the seed to be achieved by the Al-metal, the metal to be cleaned by the W-layer and then pure, high density AlN to be nitrided from the Al-melt forming a high quality seed adhesive.

4.3.6 Seed Bonding Directly to a Seed Plate without the AlN Layer

Rather than using a combination of an AlN ceramic layer and a backing plate, it may also be possible to bond the seed directly to an appropriate seed plate without the intermediary AlN ceramic layer. This may provide the advantage of eliminating the potential for defects in the AlN ceramic layer to migrate into the growing AlN boule. However, the backing plate is carefully chosen so as to not introduce too much stress onto the seed crystal and AlN boule due to thermal expansion mismatch between the seed plate and AlN. This can be accomplished either by using very thin plates that will easily deform in response to stress from the AlN crystal (yet still be relatively impervious to Al transport through the plate) or by using plates that relatively closely match the thermal expansion of AlN from room temperature up to the growth temperature of ~2200° C. Alternatively, the AlN seed crystal may be mounted on the backing plate, which may then be mounted on a textured AlN ceramic. This last approach is attractive because the seed backing plate used may provide a relatively impervious barrier to Al diffusion and prevent defects from the AlN ceramic from diffusing into the growing crystal. However, the AlN ceramic may provide the mechanical strength to hold the growing crystal boule.

Possible choices include:
i. W-foil
ii. W-Re foil
iii. W-Mo foil
iv. W-foil treated with Pt, V, Y, carbon (crucible patent reference)
v. Single crystal-W backing
vi. HfC—liquid phase sintered
vii. TaC coated Ta
viii. TaC coated pBN
ix. TaC coated W-foil
x. HfN coated W-foil
xi. HfC (hafnium carbide)
xii. HfC coated W
xiii. BN coated graphite Even though the W has a thermal expansion coefficient different from that of AlN, thin W-foil and thin single crystal-W may mechanically deform much more readily than an AlN boule of suitable thickness so as to reduce stresses on the crystal due to the thermal expansion mismatch. Alloys of W/Re and W/Mo may be selected such that the total thermal expansion of the seed holder and AlN will be zero from growth temperature down to room temperature. Combinations of these materials (all) and treatments with elements such as Pt, V, Y, carbon may be used to change the grain growth behavior of the backing material to reduce the time dependent grain growth of the material upon exposure to Al and high temperature gradients.

A similar polishing preparation process to what was described above for the AlN ceramic foundation is also suitable for direct foil mounting (without AlN foundation). To improve the surface finish further in the cases of metal backing it is generally desirable to follow the 1 μm $Al_2O_3$ deck step with a 1200-grit pad step that produces a mirror finish on the softer metal materials while maintaining flatness and low scratching.

Figure 6:
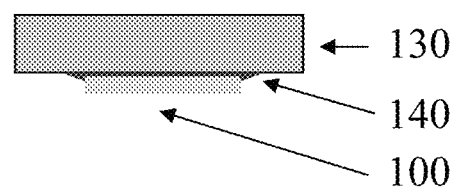
FIG. 6 is a schematic diagram of an AlN seed mounting technique using high temperature AlN ceramic-based adhesive.

The furnace operation for this seed mounting process is schematically described below. The adhesive layer is place on the prepared seed holder and the seed onto the adhesive layer. For use of the Al-foil based seed mounting adhesive, the seed holder from FIG. 6 is assembled while inverted within a station capable of reaching at least 1650° C. For materials other than Al-foil, a separate heating cycle is described later, however, the same considerations apply to maintaining high quality seeded growth results.

A suitable mass is placed on top of the seed/adhesive/seed holder assembly. In an embodiment, one may use a polished (flat) tungsten right cylinder that has been carefully outgassed of contamination by repeated heating cycles under forming gas flow. The block presses on the polished (flat) seed face with a pressure greater than 150 grams per centimeter squared area. In this case, this may be sufficient to hold a flat, stress relived seed closely against the seed holder. More pressure per area will help to improve imperfect seed/seed-holder flatness by deformation of the materials up to the point where the mass loading may cause seed/seed-holder fracture by exceeding the critical resolved sheer stress (CRSS) at room or higher temperatures.

Prior to seed assembly, the seed and seed holder are typically checked for suitable flatness using optical flatness measurement techniques such as an optical flat and a monochromatic light source (435 nm sodium lamp). Gaps between the mating surfaces are preferably less than 5 μm, preferably less, with part shapes being regular (avoid cupped or boxed pieces with deformation better than 5 μm preferred).

4.3.7 Other Possible Seed Mounting Adhesives

Instead of an AlN ceramic-based adhesive, it is possible to use any other high-temperature adhesive, e.g., carbon-based adhesives or even water-based carbon paints such as Aquadag E, molybdenum-dag, (such as from Aremco Products, Inc.) molybdenum-powder or foil, molybdenum sputter or plated coatings, similar to each of the molybdenum forms including base elements aluminum, rhenium, vanadium, yttrium. Other glues, such as boron nitride-, zirconia-, yttrium oxide-, and aluminum oxide-based glues that have a variety of high temperature stabilities/suitability at AlN growth conditions may also be used.

The carbon-based approaches have been successful for seeding SiC crystal growth. However, they have not proven successful for AlN crystal growth because Al vapor attacks the graphite forming aluminum carbide ($Al_4C_3$).

4.3.8 Using a Liquid or Break-Away Seed Mounting

As discussed above, one of the difficulties of growing bulk AlN from seed crystals mounted on seed holders that are nearly impervious to Al transport is the strain caused by the thermal expansion mismatch between the seed crystal and the seed holder plate. Stress from thermal expansion mismatch can be avoided by using a liquid or nearly liquid film to hold the seed to the seed holder plate. Metal gallium (Ga) may be substituted for one of the solid glues described above and will melt at 30° C. At high temperatures (>1,000° C.), the nitrides of Ga are not stable so the Ga will remain liquid between the AlN seed and the seed holder plate and thus will not be able to transmit any shear stress (due to thermal expansion mismatch) to the growing AlN boule. However, the liquid Ga typically forms a nitride as the crystal is cooled to room temperature. This may be avoided by using a backing plate from which the GaN will break away as it cools or by replacing the nitrogen gas in the growth chamber with an inert gas (such as Ar) so that the Ga will not be exposed to enough nitrogen to form a solid nitride bond both the seed crystal and the seed holder plate. Of course, this approach may not provide any mechanical strength to hold the seed crystal, so it is preferably used by mounting the seed crystal at the bottom of the growth crucible.

The relatively high vapor pressure of the Ga may cause contamination of the growing AlN crystal boule. This may be overcome by using a eutectic of gold and germanium. The $Au_xGe_{1-x}$ has a eutectic at x=0.72 which melts at 361° C. Again, this material does not have any stable nitrides at the AlN growth temperature and, thus, will remain liquid. In addition, its vapor pressure will be approximately 30 times lower than that of Ga at the same temperature.

4.3.9 Seed Mounting Without a Holder Plate

A large, low defect seed crystal may also be mounted by coating its back surface with a nearly impervious coating and using the seed crystal itself to seal the crystal growth crucible. By making this coating thin, mechanical stresses from the thermal expansion mismatch between the coating and the AlN seed crystal will be minimized. In the preferred embodiment of this approach, the seed crystal is first coated in DAG and then baked at 150° C. to provide a carbon coating around the entire seed (alternative carbon coating schemes may also be used). The carbon coated AlN seed crystal then has a thin layer of pyrolytic BN deposited on it (this layer is preferably approximately 100 μm thick). After this preparation, the front surface of the AlN seed crystal is polished as described above in the section on seed crystal preparation, so that the front surface has substantially all of the BN and graphite removed, and is smooth and relatively defect-free as described in that section. This integrated seed crystal and seed holder assembly will then be mounted directly as the lid for the AlN crystal growth crucible.

Those skilled in the art will readily appreciate that all parameters listed herein are meant to be exemplary and actual parameters depend upon the specific application for which the methods and materials of the present invention are used. It is, therefore, to be understood that the foregoing embodiments are presented by way of example only and that, within the scope of the appended claims and equivalents thereto, the invention may be practiced otherwise than as specifically described.

What is claimed is:

1. A boule comprising a bulk single crystal of AlN having a sufficient thickness to enable the formation of at least five wafers therefrom, each wafer having a thickness of at least 0.1 mm, a diameter of at least 20 mm, and, an areal density of voids, disposed within the wafer or intersecting a surface thereof, of less than or equal to 100 $cm^{-2}$.

2. The boule of claim 1, wherein the areal density of voids in each wafer is less than or equal to 1 $cm^{-2}$.

3. The boule of claim 1, wherein an areal density of voids within the boule proximate a first end of the boule is larger than an areal density of voids within the boule proximate a second end of the boule opposite the first end.

4. The boule of claim 1, wherein a diameter of each wafer is substantially the same as a diameter of each of the other wafers.

5. The boule of claim 1, further comprising a small-angle grain boundary extending from at least one of the voids into the boule.

6. The boule of claim 1, wherein a width of each of at least some of the voids ranges from 0.1 to 2 mm.

7. The boule of claim 1, wherein a depth of each of at least some of the voids is 0.5 mm or less.

8. The boule of claim 1, wherein at least some of the voids are hexagonal in shape.

9. The boule of claim 1, further comprising a plurality of dislocations associated with at least one of the voids.

10. The boule of claim 9, wherein a density of the dislocations is at least $10^4$ $cm^{-2}$.

11. The boule of claim 1, wherein a thickness of the boule is at least 1 mm.

12. The boule of claim 1, wherein a thickness of the boule is at least 5 mm.

13. The boule of claim 1, wherein the thickness of each of the wafers is 1 mm or less.

14. The boule of claim 1, wherein a crystalline orientation of the boule varies by no more than 1.5° across a width of the boule.

15. The boule of claim 1, wherein the diameter of each of the wafers is approximately 60 mm or less.

16. The boule of claim 1, wherein the areal density of voids in each wafer is at least 1 $cm^{-2}$.

17. The boule of claim 1, wherein an areal density of threading dislocations in each wafer ranges from 100 $cm^{-2}$ to $10^6$ $cm^{-2}$.

18. The boule of claim 1, wherein an areal density of threading dislocations in each wafer ranges from 100 $cm^{-2}$ to $10^4$ $cm^{-2}$.

19. The boule of claim 1, wherein each wafer exhibits a triple-crystal X-ray rocking curve of less than 50 arcsec full width at half maximum (FWHM) for a (0002) reflection.

20. The boule of claim 1, wherein a diameter of the boule increases along at least a portion of a length of the boule.

21. The boule of claim 1, further comprising a single-crystal AlN seed crystal from which the boule extends.

\* \* \* \* \*